(12) United States Patent
Jensen et al.

(10) Patent No.: US 11,539,200 B2
(45) Date of Patent: Dec. 27, 2022

(54) MONITOR DEVICE, GROUND FAULT PROTECTION CIRCUIT AND TECHNIQUES

(71) Applicant: Littelfuse, Inc., Chicago, IL (US)

(72) Inventors: Kristophor Jensen, Chicago, IL (US); Kip M. Larson, Rapid City, SD (US); Cornelis Verhey, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 747 days.

(21) Appl. No.: 16/297,501

(22) Filed: Mar. 8, 2019

(65) Prior Publication Data

US 2019/0288502 A1    Sep. 19, 2019

Related U.S. Application Data

(60) Provisional application No. 62/644,359, filed on Mar. 16, 2018.

(51) Int. Cl.
*H02H 1/00* (2006.01)
*H02H 3/16* (2006.01)
*H02H 3/33* (2006.01)
*H02H 5/10* (2006.01)
*G01R 31/50* (2020.01)
*H02H 9/08* (2006.01)

(52) U.S. Cl.
CPC .............. *H02H 1/003* (2013.01); *G01R 31/50* (2020.01); *H02H 3/16* (2013.01); *H02H 3/331* (2013.01); *H02H 5/105* (2013.01); *H02H 9/08* (2013.01)

(58) Field of Classification Search
CPC .. H02H 3/33; H02H 5/10; H02H 3/16; H02H 3/331; H02H 3/17; G01R 31/02
See application file for complete search history.

(56) References Cited

U.S. PATENT DOCUMENTS

| 3,848,159 | A | 11/1974 | Nye, Jr. et al. |
| 5,508,620 | A | 4/1996 | Pfiffner |
| 7,180,300 | B2 | 2/2007 | Premerlani et al. |
| 8,405,940 | B2 | 3/2013 | Schweitzer, III et al. |
| 8,878,396 | B2 * | 11/2014 | Faxvog ............ H02H 3/52 307/126 |

(Continued)

FOREIGN PATENT DOCUMENTS

| DE | 2458530 A1 | 5/1976 |
| EP | 0360109 A1 | 3/1990 |

(Continued)

OTHER PUBLICATIONS

European Search Report for the European Patent Application No. EP19163284, dated Aug. 14, 2019, 2 pages.

(Continued)

*Primary Examiner* — Scott Bauer
(74) *Attorney, Agent, or Firm* — KDB Firm PLLC

(57) ABSTRACT

A fault protection arrangement may include a neutral grounding resistor, the neutral grounding resistor comprising a ground end and a non-ground end. The fault protection arrangement may include a neutral grounding resistance monitor assembly, coupled to the neutral grounding resistor, where the neutral grounding resistance monitor assembly includes a sense circuit, coupled to the ground end of the neutral grounding resistor; and an injection signal generator, arranged to generate a frequency of 240 Hz or greater.

16 Claims, 5 Drawing Sheets

(56) References Cited

U.S. PATENT DOCUMENTS

| | | |
|---|---|---|
| 2004/0130326 A1 | 7/2004 | Yamamoto |
| 2007/0176604 A1 | 8/2007 | Morimoto |
| 2009/0278547 A1 | 11/2009 | Acena |
| 2011/0085272 A1* | 4/2011 | Schweitzer, III ........ H02H 7/06 361/47 |
| 2012/0014020 A1 | 1/2012 | Lehmann |
| 2012/0194200 A1* | 8/2012 | McDiarmid ........... G01R 31/74 324/509 |
| 2013/0328405 A1 | 12/2013 | Bai |
| 2014/0176163 A1 | 3/2014 | Ripoll |
| 2014/0153142 A1 | 6/2014 | Callsen |
| 2015/0048840 A1 | 2/2015 | Vangool |
| 2015/0168476 A1 | 6/2015 | Park |
| 2015/0346262 A1 | 8/2015 | Curtis |
| 2015/0346264 A1 | 8/2015 | Curtis |

FOREIGN PATENT DOCUMENTS

| | | |
|---|---|---|
| EP | 2772770 A1 | 9/2014 |
| JP | 2002131361 A | 5/2002 |

OTHER PUBLICATIONS

European Search Report for the European Patent Application No. EP19163281, dated Aug. 14, 2019, 2 pages.

* cited by examiner

POWER SYSTEM IS CONNECTED TO FAULT PROTECTION
ARRANGEMENT
802

RESISTANCE OF NEUTRAL GROUNDING RESISTOR IS PROBED
BY SENDING INJECTION SIGNAL FROM INJECTION SIGNAL
GENERATOR THROUGH NON-GROUND END TO GROUND END,
AND TO SENSE CIRCUIT, COUPLED TO GROUND END
804

ALARM SIGNAL IS GENERATED WHEN RESISTANCE OF
NEUTRAL GROUNDING RESISTOR FALLS OUTSIDE OF
PREDETERMINED RANGE.
806

MONITOR DEVICE, GROUND FAULT PROTECTION CIRCUIT AND TECHNIQUES

RELATED APPLICATIONS

This Application claims priority to U.S. Provisional Patent Application No. 62/644,359, filed Mar. 16, 2018, entitled MONITOR DEVICE, GROUND FAULT PROTECTION CIRCUIT AND TECHNIQUES, and incorporated by reference herein in its entirety.

BACKGROUND

Field

Embodiments relate to the field of protection devices, an in particular, to neutral grounding resistors.

Discussion of Related Art

Ground fault resistors, or neutral grounding resistors, may be used in conjunction with resistance grounded power systems. A neutral grounding resistor may be deployed under conditions where a ground fault is to be limited to a predetermined current. Neutral grounding resistors may also be accompanied by a monitor to monitor when degradation of neutral grounding resistor may take place. In some jurisdictions, monitoring of neutral grounding resistors is required during all operation phases for changes in resistance value.

In view of the above, the present embodiments are provided.

BRIEF SUMMARY

In one embodiment, a fault protection arrangement is provided, including a neutral grounding resistor, comprising a ground end and a non-ground end. The fault protection arrangement may include a neutral grounding resistance monitor assembly, coupled to the neutral grounding resistor, where the neutral grounding resistance monitor includes a sense circuit, coupled to the ground end of the neutral grounding resistor, and an injection signal generator, arranged to generate a frequency of 240 Hz or greater.

In another embodiment, a fault protection arrangement may include a neutral grounding resistor, comprising a ground end and a non-ground end, and a neutral grounding resistance monitor assembly, coupled to the neutral grounding resistor. The neutral grounding resistance monitor assembly may include a sense circuit, coupled to the non-ground end of the neutral grounding resistor; and an injection signal generator, coupled to the ground end of the neutral grounding resistor and arranged to generate a frequency of 240 Hz or greater.

In a further embodiment, a fault protection method may include providing a neutral grounding resistor, having a ground end, coupled to ground, and a non-ground end, and generating, by an injection signal generator, an injection signal having an injection signal frequency, above 240 Hz, wherein the injection signal travels to the neutral grounding resistor along at the non-ground end. The fault protection method may further include sensing a resistance of the neutral grounding resistor using a sense circuit, electrically coupled between the ground end of the neutral grounding resistor and the injection signal generator.

BRIEF DESCRIPTION OF THE DRAWINGS

FIG. 8 depicts an exemplary process flow.

DESCRIPTION OF EMBODIMENTS

Figure 1A:
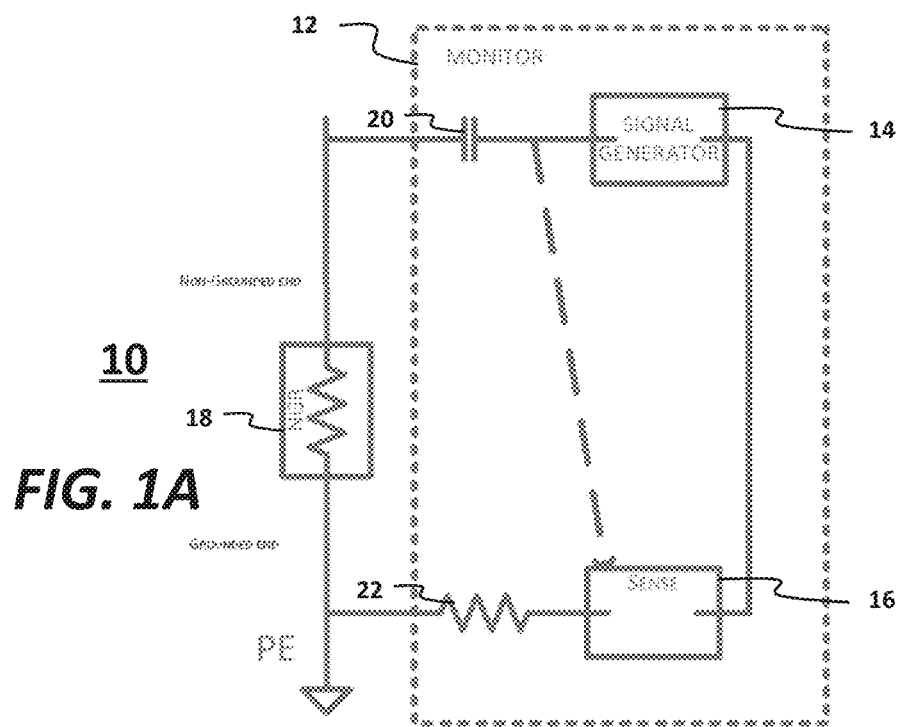
FIG. 1A shows a protection arrangement according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, systems, devices, and methods are provided for providing fault protection. As disclosed hereinbelow, neutral grounding resistors are provided with a monitor assembly, which assembly may include an injection signal generator to inject an AC signal to monitor the neutral grounding resistor. FIG. 1A shows a fault protection arrangement 10 according to various embodiments of the disclosure. The fault protection arrangement 10 may include a neutral grounding resistor 18, where the neutral grounding resistor has a ground end and a non-ground end. While not shown, the non-ground end may be coupled to a power system, or other component or equipment to be protected. During operation, the neutral grounding resistor 18 is designed to present a fixed electrical resistance, to treat a given fault energy received, for example, over a line between the neutral grounding resistor and power system (not shown). In particular, the neutral grounding resistor 18 may be coupled to the neutral of a power system to limit fault current, providing a path for grounding current to a transformer neutral. Excessive changes in the resistance value of the neutral grounding resistor 18 may cause harm to a system being protected. In accordance with embodiments of the disclosure, the fault protection arrangement 10 provides monitoring and control to determine the state of the neutral grounding resistor 18.

As shown in FIG. 1A, the fault protection arrangement 10 may include a neutral grounding resistance monitor assembly 12, coupled to the neutral grounding resistor 18. The neutral grounding resistance monitor assembly 12 may function to monitor the neutral grounding resistor 18, so as to detect changes in the neutral grounding resistor, such as changes in resistance. The monitoring may be performed in an intermittent, semicontinuous, or continuous fashion, so as to detect changes in resistance in a timely fashion, to allow the fault protection arrangement to alarm or shut down a power system as necessary, without causing harm.

As further shown in FIG. 1A, the fault protection arrangement 10, and in particular, the neutral grounding resistance monitor assembly 12, may include a sense circuit 16, coupled to the ground end of the neutral grounding resistor 18, as well as an injection signal generator 14. According to different embodiments of the disclosure, the sense circuit 16 and injection signal generator 14, as well as auxiliary components, may be arranged in different configurations to provide effective monitoring of the neutral grounding resistor 18. Generally, the injection signal generator 14 may be arranged to generate an alternating current signal (AC signal), operating at a signal frequency of 240 Hz or higher, and in some non-limiting embodiments, operating at hundreds of kHz, or megahertz. The injection signal generator 14 may include or may accompany a signal processing circuit, according to embodiments of the disclosure.

In various different configurations, described herein, the sense circuit 16 and injection signal generator 14, may operate together as a neutral grounding resistor monitor for the neutral grounding resistor 18. In the embodiment of FIG. 1A, the neutral grounding resistance monitor assembly 12 further arranges the injection signal generator 14 to be coupled on a first side to the non-ground end of the neutral grounding resistor 18, and on a second side to the sense circuit 16.

In addition, the neutral grounding resistance monitor assembly 12 further comprises an injection capacitor 20, coupled in electrical series between the injection signal generator 14 and the non-ground end of the neutral grounding resistor 18. Moreover, the neutral grounding resistance monitor assembly 12 further comprises a sense resistor 22, coupled in electrical series between the sense circuit 16 and the ground end of the neutral grounding resistor 18.

Advantageously, the injection signal generator 14 may operate below approximately 1 MHz in some embodiments. In operation, a high frequency signal of any suitable waveform is sent by the injection signal generator 14 to the neutral grounding resistor 18 along an electrical path including the injection capacitor 20. In accordance with various embodiments, the injection signal generator may include logic and circuitry, embodied in any combination of software and hardware, to modify the waveform shape, as well as to scan an installation with a frequency sweep to determine optimal frequency and installation parasitic losses. Moreover, a search algorithm may be implemented to find optimal frequencies for the system installation.

The injection capacitor 20 may be sized to exhibit an appropriate capacitance and breakdown voltage according to the system to be protected. Particularly, the injection capacitor 20 may exhibit a capacitance of hundreds of picoFarads, nanoFarads, to hundreds of nanoFarads. By use of suitable capacitance for the injection capacitor 20 at an appropriate probe frequency, such as 300 kHz, small changes in impedance of the neutral grounding resistor 18 may be ascertained, as detailed in the embodiments to follow. In accordance with various embodiments of the disclosure, an injection capacitor 20 may be implemented in different configurations, including a co-axial arrangement of conductors, a parallel plate capacitor, a multilayer capacitor, such as in a printed circuit board, or other known capacitor. The embodiments are not limited in this context.

In some embodiments, the frequency of the injection signal generator 14 may range from 240 Hz to 10 MHz, while the edge rate range from 240 Hz to 10 GHz. In particular embodiments, the repetition rate may range from 100 kHz to 5 MHz, while the edge rate ranges from 100 kHz to 1 GHz. The signals generated by injection signal generator 14 may be used to probe resistance of a neutral grounding resistor in open state, short circuit state, or a changing value under normal operation. In addition, system inductance, NGR inductance, connection inductance, system capacitance, NGR capacitance, and connection capacitance may be probed by the signals.

In various embodiments, the injection signal generator 14 may be coupled to an alarm circuit (not shown), to generate an alarm signal when the resistance of the neutral grounding resistor 18 falls outside of a predetermined range.

As further depicted in FIG. 1A, the neutral grounding resistance monitor assembly 12 may further include a sense resistor 22, coupled in electrical series between the sense circuit 16 and the ground end of the neutral grounding resistor 18.

While configurations are possible where injection signal generator and sense circuit are coupled to the non-ground end of a neutral grounding resistor, in the embodiment of FIG. 1A, the configuration provides an isolated current loop. Thus, impedance may be determined according to the simple relation V/I, providing greater accuracy.

Figure 1B:
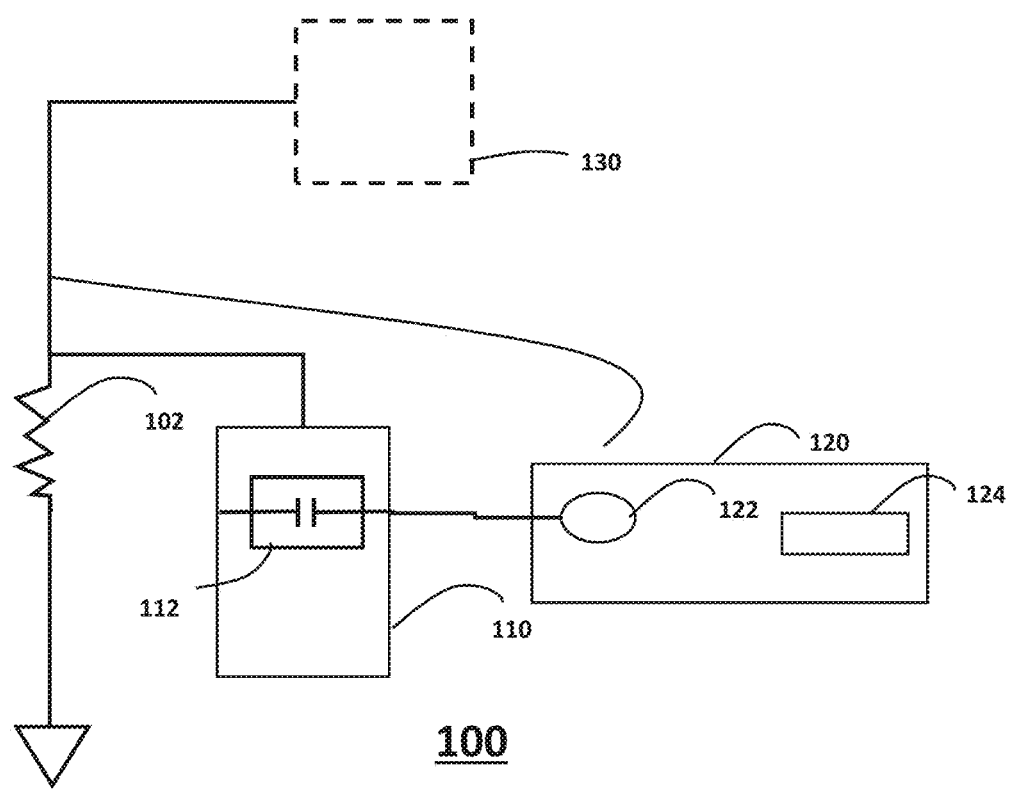
FIG. 1B shows an additional protection arrangement according to various embodiments of the disclosure.

FIG. 1B shows a protection arrangement 100 according to various embodiments of the disclosure. In this example, an injection signal generator and sense circuit are coupled to a non-ground end of a neutral grounding resistor. The protection arrangement 100 involves a neutral grounding resistor 102, electrically coupled to ground and coupled to a power system 130. The power system 130 may include various known components including transformers and other equipment. The neutral grounding resistor 102 may be designed to provide a target resistance over any suitable range, such as 10Ω to thousands of Ω. The embodiments are not limited in this context. During operation, the neutral grounding resistor 102 is designed to present a fixed electrical resistance, to treat a given fault energy received, for example, over a line between the neutral grounding resistor and power system 130. In particular, the neutral grounding resistor 102 may be coupled to the neutral of a power system to limit fault current, providing a path for grounding current to a transformer neutral. Excessive changes in the resistance value of the neutral grounding resistor 102 may cause harm to a system being protected. In accordance with embodiments of the disclosure, the protection arrangement 100 provides monitoring and control to determine the state of the neutral grounding resistor 102.

The protection arrangement 100 includes a sense circuit 110 and signal generation circuit 120, acting as a monitor for the neutral grounding resistor 102. The signal generation circuit 120 may include injection signal generator 122, while the sense circuit includes capacitor 112. The injection signal generator 122 may operate at the kHz to GHz range in various non-limiting embodiments. Advantageously, the injection signal generator 122 may operate below approximately 1 MHz in some embodiments. In operation, a high frequency signal of any suitable waveform is sent by the injection signal generator 122 to the neutral grounding resistor 102 along an electrical path including the capacitor 112. The capacitor 112 may be sized to exhibit an appropriate capacitance and breakdown voltage according to the system to be protected. Particularly, the capacitor 112 may exhibit a capacitance of hundreds of picoFarads, nanoFarads, to hundreds of nanoFarads. By use of suitable capacitance for the capacitor 112 at an appropriate probe frequency, such as 300 kHz, small changes in impedance of the neutral ground resistor 102 may be ascertained, as detailed in the embodiments to follow.

In some embodiments, the repetition frequency of the injection signal generator 122 may range from 240 Hz to 10 MHz, while the edge rate range from 240 Hz to 10 GHz. In particular embodiments, the repetition rate may range from 100 kHz to 5 MHz, while the edge rate ranged from 100 kHz to 1 GHz. The signals generated by injection signal generator 122 may be used to probe resistance of a neutral grounding resistor in open state, short circuit state, or a changing value under normal operation. In addition, system inductance, NGR inductance, connection inductance, system capacitance, NGR capacitance, and connection capacitance may be probed by the signals.

As further shown in FIG. 1B, the signal generation circuit may further include an alarm circuit 124, to generate an alarm signal when the resistance of the neutral grounding resistor 102 falls outside of a predetermined range.

Figure 2:
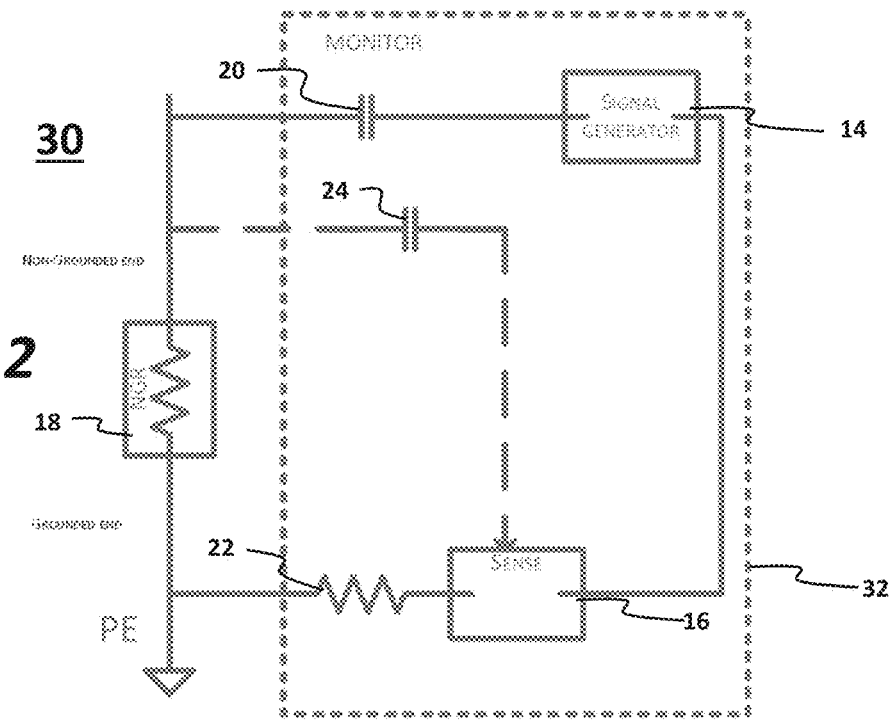
FIG. 2 shows another protection arrangement in accordance to additional embodiments of the disclosure.

Turning now to FIG. 2, there is shown another embodiment, where fault protection arrangement 30 includes a neutral grounding resistor monitor assembly 32, having a similar arrangement to that of FIG. 1A. In this embodiment, in addition to the aforementioned components of FIG. 1A, the neutral grounding resistor monitor assembly 32 includes a sense capacitor 24, coupled in electrical series between the sense circuit 16 and the non-ground end of the neutral grounding resistor 18.

This arrangement allows for a more accurate voltage measurement. The improved accuracy is achieved by removing the phase shift provided by the injection capacitor 20. The phase shift in the injection capacitor 20 is created by virtue of the current of the excitation signal emitted by the injection signal generator 14. Additionally, the configuration of FIG. 2 removes the equivalent series resistance (ESR) of injection capacitor 20 from the neutral grounding resistor measurement. For example, a known injection capacitor may exhibit 104 Ohms ESR at 150 kHz excitation frequency, comparable to a common resistance value of a neutral grounding resistor, in the range of 10 Ohm to 1000 Ohm.

Figure 3:
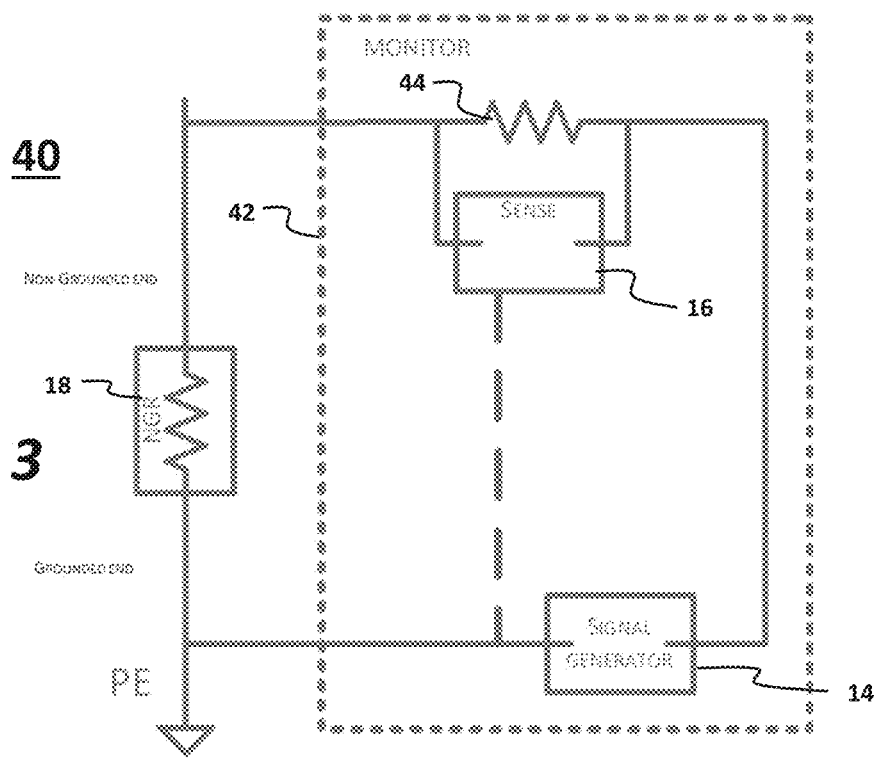
FIG. 3 shows an additional protection arrangement in accordance to additional embodiments of the disclosure.
Figure 4:
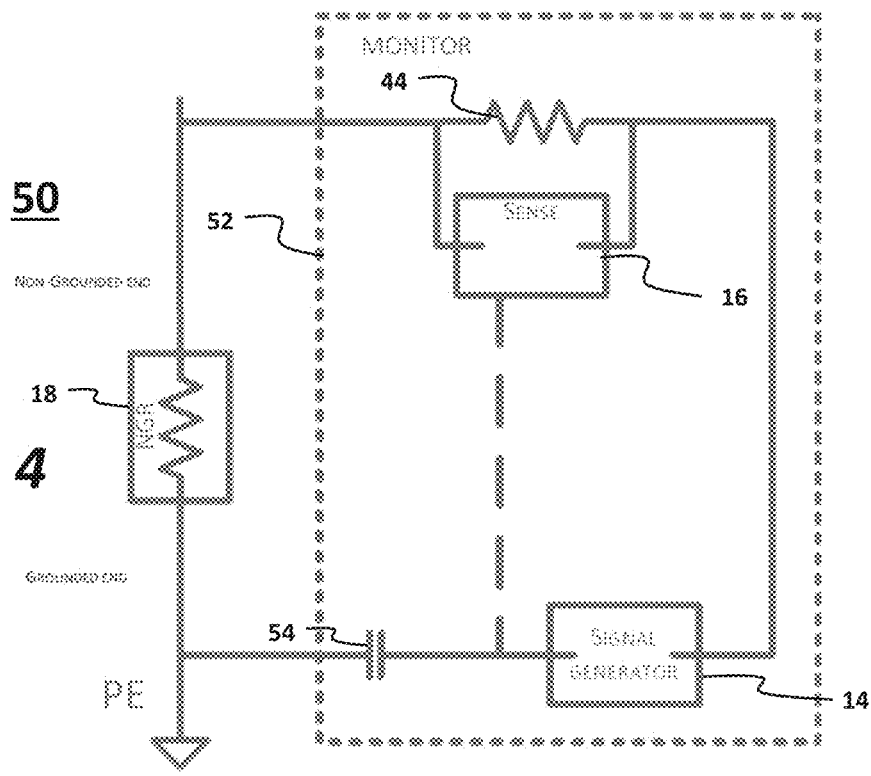
FIG. 4 shows a further protection arrangement in accordance to additional embodiments of the disclosure.
Figure 5:
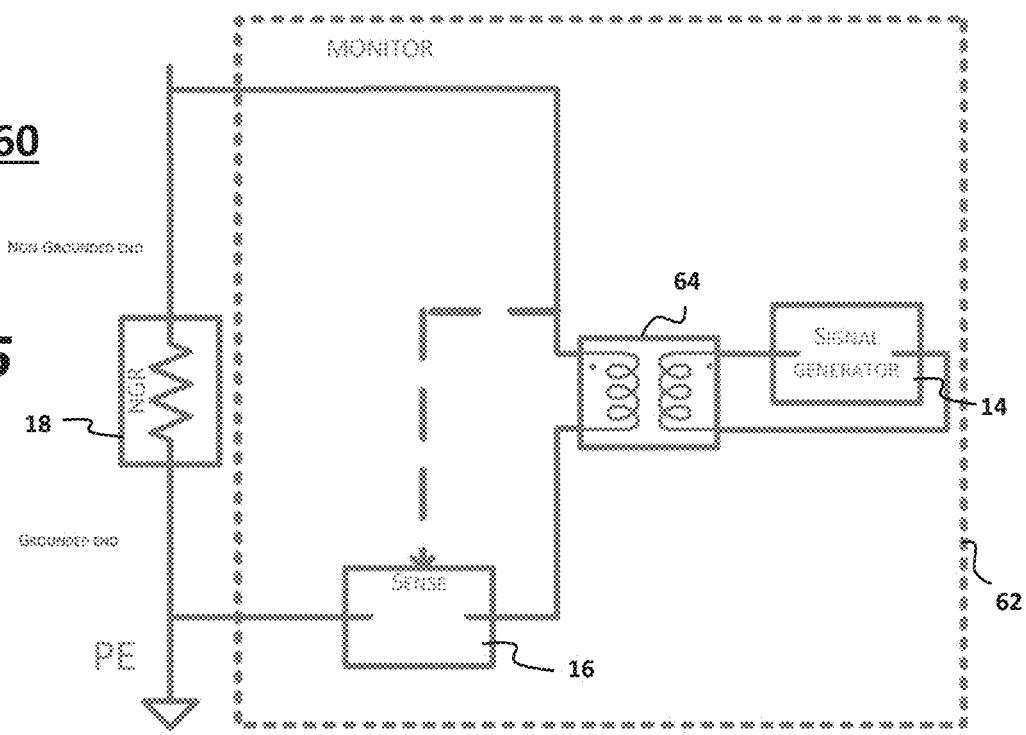
FIG. 5 shows still another protection arrangement in accordance to additional embodiments of the disclosure.

Turning now to FIG. 3, there is shown another fault protection arrangement, shown as fault protection arrangement 40, in accordance with further embodiments of the disclosure. In this example, a neutral grounding resistance monitor assembly 42 is provided with similar components to the components of the arrangement of FIG. 1A. Notably, in this arrangement, the sense circuit 16 is coupled to the non-ground end of the neutral grounding resistor 18, instead of the ground end. The injection signal generator 14 is coupled to the ground end of the neutral grounding resistor 18, instead of the non-ground end. As further shown in FIG. 3, a resistor 44 is provided in electrical series between a first end of the injection signal generator 14 and the non-ground end of the neutral grounding resistor 18. The resistor 44 is also arranged to be electrically parallel to the sense circuit 16, which circuit is also arranged in electrical series between the first end of the injection signal generator 14 and the non-ground end of the neutral grounding resistor 18. Turning now to FIG. 4, there is shown a fault protection arrangement 50, a variant of the fault protection arrangement 40, in accordance with further embodiments of the disclosure. In this arrangement, a neutral grounding resistance monitor assembly 52 includes a similar arrangement of components to neutral grounding resistance monitor assembly 42, with the addition of an injection capacitor 54, disposed in electrical series between the injection signal generator 14 and the ground end of the neutral grounding resistor 18. This arrangement, while potentially adding cost, advantageously does not suffer a voltage measurement phase shift due to the capacitor, and may be useful for lower power systems, in some implementations. In additional embodiments of the disclosure, arrangements may be provided for magnetically coupled signal injection and measurement. Magnetic coupling may be in the form of a specially designed transformer. A transformer will introduce a phase offset, but the phase offset may be characterized for open-loop correction. Alternatively, the phase offset introduced may be measured in the sense circuitry for closed-loop correction. FIG. 5 depicts one such embodiment of a fault protection arrangement 60. In this arrangement, a neutral grounding resistance monitor assembly 62 is provided including a transformer 64, where the sense circuit 16 is arranged in electrical series on a first side of the transformer 64, between the transformer 64 and the ground end of the neutral grounding resistor 18. The injection signal generator 14 is arranged on a second side of the transformer.

Figure 6:
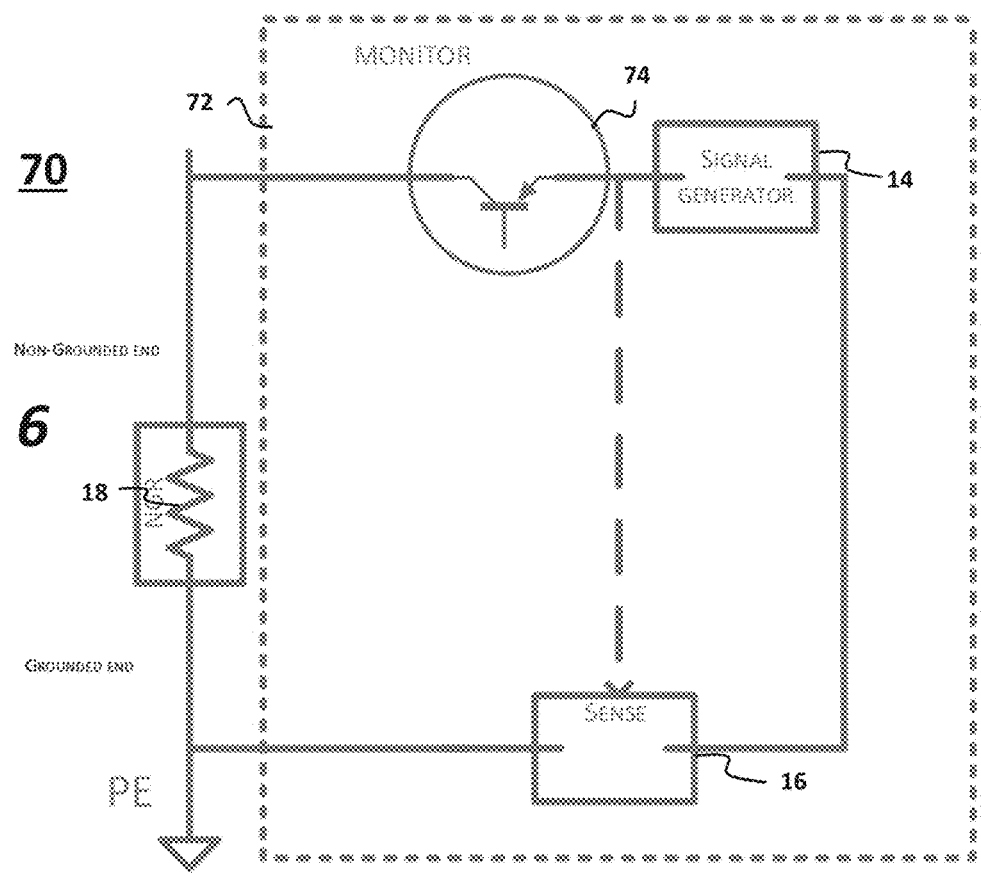
FIG. 6 shows another protection arrangement in accordance to additional embodiments of the disclosure.

FIG. 6 depicts another embodiment of a fault protection arrangement 70, according to further embodiments of the disclosure. In this arrangement, a neutral grounding resistance monitor assembly 72 is provided including a first transistor 74, arranged in electrical series between the injection signal generator 14 and the non-ground end of the neutral grounding resistor 18. The first transistor 74 may be arranged as a high voltage transistor.

Figure 7:
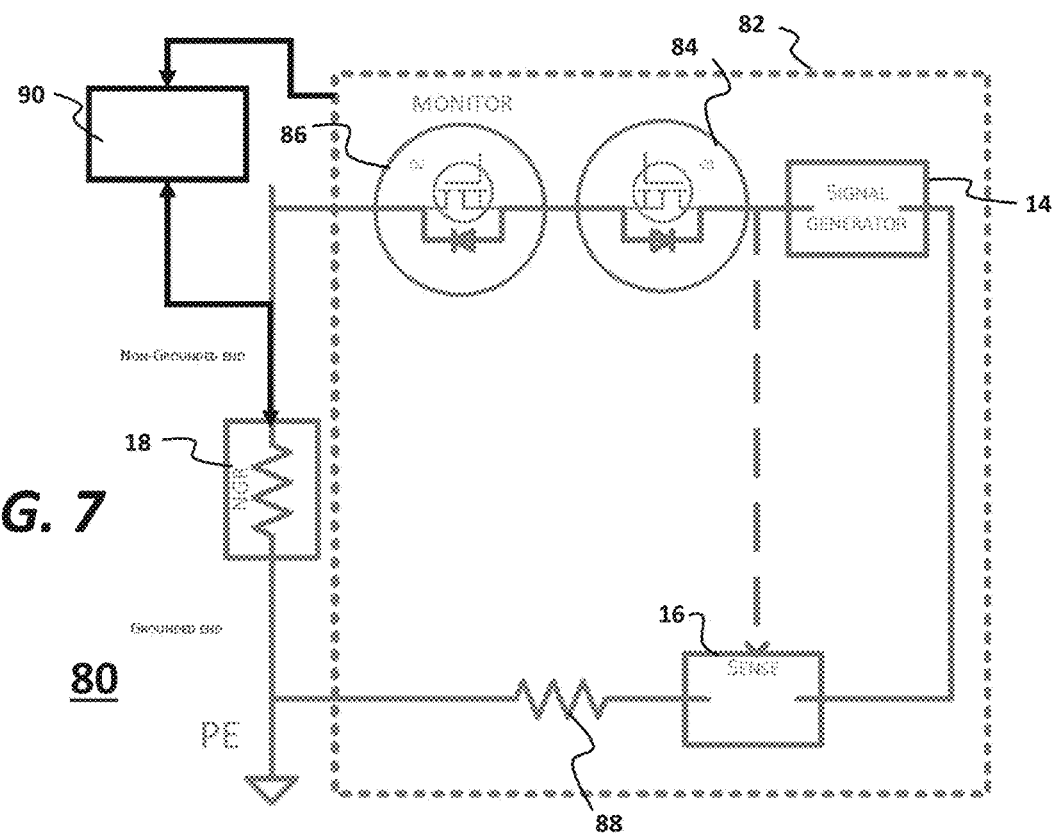
FIG. 7 depicts yet another exemplary protection arrangement, according to further embodiments of the disclosure.

FIG. 7 depicts another embodiment of a fault protection arrangement 80, according to further embodiments of the disclosure. In this arrangement, a sense resistor 88 is provided in electrical series between the sense circuit 16 and ground end of the neutral grounding resistor 18 in the neutral grounding resistance monitor assembly 82. A transistor assembly is provided in electrical series between the non-ground end of the neutral grounding resistor 18 and the injection signal generator 14. The transistor assembly is shown as a first transistor 84 and a second transistor 86, arranged in electrical series between the non-ground end of the neutral grounding resistor 18 and the injection signal generator 14. As shown, the fault protection arrangement 80 may include a control circuit 90, coupled to the neutral grounding resistor 18 and the neutral grounding resistance monitor assembly 82. The control circuit 90 may measure the presence of a ground fault condition, as in known systems. At the inception of a fault, the control circuit 90 may send a signal to ensure the transistor assembly is not in an ON state, preventing damage to the first transistor 84 and second transistor 86. Notably, this two-transistor configuration defeats the limitation of a single transistor configuration with a parasitic body diode. In operation, both the first transistor 84 and the second transistor 86 may be turned on and off at the same time. The first transistor 84 and the second transistor 86 are arranged in a manner that the respective parasitic diodes formed, are placed in an anode-to-anode configuration as shown (or alternatively in a cathode-to cathode configuration), allowing an AC signal to be propagated from the injection signal generator 14 to the neutral grounding resistor, while blocking many thousands of volts in the off state. In particular, the fault protection arrangement 80 may be operated such that the first transistor 84 and second transistor 86 are turned on just for a few milliseconds or so, at intervals such as 1 second, 2 seconds, 5 seconds, or other interval, generally less than 10 seconds, so that timely information is provided as to the resistance of the neutral grounding resistor 18.

FIG. 8 depicts an exemplary process flow 800. At block 802, a power system is connected to a fault protection arrangement. According to various embodiments, the fault protection arrangement may include a neutral grounding resistor, the neutral grounding resistor comprising a ground end and a non-ground end; a sense circuit, coupled to the non-ground end of the neutral grounding resistor, the sense circuit comprising a sense resistor, and an injection capacitor; and an injection signal generator, coupled to the non-ground end of the neutral grounding resistor. At block 804, a resistance of the neutral grounding resistor is probed by sending an injection signal from the sense circuit to the neutral grounding resistor through the non-ground end to ground end, and through to sense circuit, coupled to ground end.

At block 806, and alarm signal is generated when the resistance of neutral grounding resistor falls outside of predetermined range.

In sum, the present embodiments provide components, circuit arrangements and techniques to conveniently monitor small changes in resistance, such as in neutral grounding resistors. One or more components of a neutral grounding resistor monitor assembly are coupled to the ground end of the neutral grounding resistor in accordance with various embodiments.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A fault protection arrangement, comprising:
a neutral grounding resistor, the neutral grounding resistor comprising a ground end and a non-ground end; and
a neutral grounding resistance monitor assembly, coupled to the neutral grounding resistor and comprising:
a sense circuit, coupled to the ground end of the neutral grounding resistor;
an injection signal generator, arranged to generate a frequency of 240 Hz or greater, wherein the injection signal generator is coupled on a first side to the non-ground end of the neutral grounding resistor, and on a second side to the sense circuit; and
an injection capacitor, coupled in electrical series between the injection signal generator and the non-ground end of the neutral grounding resistor.

2. The fault protection arrangement of claim 1, the neutral grounding resistance monitor assembly further comprising a sense resistor, coupled in electrical series between the sense circuit and the ground end of the neutral grounding resistor, and a sense capacitor, coupled in electrical series between the sense circuit and the non-ground end of the neutral grounding resistor.

3. The fault protection arrangement of claim 1, the neutral grounding resistance monitor assembly further comprising a transformer, wherein the sense circuit is arranged in electrical series on a first side of the transformer, between the transformer and the ground end of the neutral grounding resistor, and wherein the injection signal generator is arranged on a second side of the transformer.

4. The fault protection arrangement of claim 1, wherein the neutral grounding resistance monitor assembly further comprising a first transistor, disposed between the injection signal generator and the non-ground end of the neutral grounding resistor.

5. The fault protection arrangement of claim 4, the neutral grounding resistance monitor assembly further comprising a second transistor, disposed in electrical series between the injection signal generator and the non-ground end of the neutral grounding resistor.

6. The fault protection arrangement of claim 4, further comprising a sense resistor, disposed between the sense circuit and the ground end of the neutral grounding resistor.

7. The fault protection arrangement of claim 1, wherein the injection signal generator is configured to generate an alternating current signal having a frequency in a 100 kHz to 900 kHz range.

8. The fault protection arrangement of claim 1, wherein the injection signal generator is configured to generate an alternating current signal having a frequency in a 100 kHz to 900 kHz range.

9. A fault protection arrangement, comprising:
a neutral grounding resistor, the neutral grounding resistor comprising a ground end and a non-ground end; and
a neutral grounding resistance monitor assembly, coupled to the neutral grounding resistor and comprising:
a sense circuit, coupled to the non-ground end of the neutral grounding resistor; and
an injection signal generator, coupled to the ground end of the neutral grounding resistor and arranged to generate a frequency of 240 Hz or greater; and
a sense resistor, arranged in electrically parallel fashion with the sense circuit, between the non-ground end of the neutral grounding resistor, and the injection signal generator.

10. The fault protection arrangement of claim 9, wherein the sense circuit is coupled on a first side to the non-ground end of the neutral grounding resistor, and on a second side to the injection signal generator.

11. The fault protection arrangement of claim 9, further comprising an injection capacitor, arranged in electrical series between the injection signal generator and the ground end of the neutral grounding resistor.

12. A fault protection method, comprising:
providing a neutral grounding resistor, having a ground end, coupled to ground, and a non-ground end;
generating, by an injection signal generator coupled on a first side to the non-ground end of the neutral grounding resistor, an injection signal having an injection signal frequency, above 240 Hz; and
sensing a resistance of the neutral grounding resistor using a sense circuit, electrically coupled between the ground end of the neutral grounding resistor and the injection signal generator;
wherein an injection capacitor is arranged in electrical series between the injection signal generator and the non-ground end of the neutral grounding resistor, and wherein a sense resistor is arranged in electrical series between the ground end of the neutral grounding resistor and the sense circuit.

13. The fault protection method of claim 12, wherein a second capacitor is arranged in electrical series between the non-ground end and the sense circuit.

14. The fault protection method of claim 12, wherein a transformer is coupled between the injection signal generator and the neutral grounding resistor, and coupled between the injection signal generator and the sense circuit.

15. The fault protection method of claim 12, wherein a transistor assembly is coupled in electrical series between the injection signal generator and the non-ground end, and wherein the injection signal travels through the transistor assembly.

16. The fault protection method of claim 12, wherein the injection signal frequency is in a 100-kHz to 900 kHz range.

* * * * *